United States Patent
Shi et al.

(10) Patent No.: US 10,177,295 B2
(45) Date of Patent: Jan. 8, 2019

(54) P-TYPE HIGH-PERFORMANCE THERMOELECTRIC MATERIAL WITH REVERSIBLE PHASE CHANGE, AND PREPARATION METHOD THEREFOR

(71) Applicant: SHANGHAI INSTITUTE OF CERAMICS, CHINESE ACADEMY OF SCIENCES, Shanghai (CN)

(72) Inventors: Xun Shi, Shanghai (CN); Huili Liu, Shanghai (CN); Lidong Chen, Shanghai (CN)

(73) Assignee: SHANGHAI INSTITUTE OF CERAMICS, CHINESE ACADEMY OF SCIENCES, Shanghai (CN)

( * ) Notice: Subject to any disclaimer, the term of this patent is extended or adjusted under 35 U.S.C. 154(b) by 341 days.

(21) Appl. No.: 14/895,882

(22) PCT Filed: May 29, 2014

(86) PCT No.: PCT/CN2014/078764
§ 371 (c)(1),
(2) Date: Dec. 3, 2015

(87) PCT Pub. No.: WO2014/194788
PCT Pub. Date: Dec. 11, 2014

(65) Prior Publication Data
US 2016/0126439 A1    May 5, 2016

(30) Foreign Application Priority Data

Jun. 4, 2013 (CN) .......................... 2013 1 0220037

(51) Int. Cl.
*H01L 35/16* (2006.01)
*C01B 9/06* (2006.01)
*H01L 35/32* (2006.01)
*C01B 19/00* (2006.01)
*C01G 3/00* (2006.01)

(52) U.S. Cl.
CPC ................ *H01L 35/16* (2013.01); *C01B 9/06* (2013.01); *C01B 19/002* (2013.01);
(Continued)

(58) Field of Classification Search
CPC ....... C01B 19/002; C01B 19/007; C01B 9/06; C01G 3/006; H01L 35/32; H01L 35/16;
(Continued)

(56) References Cited

U.S. PATENT DOCUMENTS 8,968,589 B2 *  3/2015  Chen ....................... B82Y 30/00
                                                 136/240
2014/0345663 A1* 11/2014 Hayakawa .............. H01L 35/14
                                                 136/205

FOREIGN PATENT DOCUMENTS

CN         1718811 A       1/2006
CN       101273474 A       9/2008
(Continued)

OTHER PUBLICATIONS

Yu,"Power Factor Improvement and Thermal Conductivity Reduction -by Band Engineering and Modulation-doping in Nanocomposites", Boston College Electronic Thesis or Dissertation, Apr. 2012.*
(Continued)

*Primary Examiner* — Devina Pillay
(74) *Attorney, Agent, or Firm* — Alleman Hall Creasman & Tuttle LLP

(57) ABSTRACT

The present invention relates to a P-type high-performance thermoelectric material featuring reversible phase change, and a preparation method therefor. The thermoelectric material has a chemical composition of $Cu_2Se_{1-x}I_x$, wherein $0<x\leq 0.08$. The method comprises: weighing elemental copper metal, elemental selenium metal, and cuprous iodide according to the molar ratio (2-x):(1-x):x, and packaging them in a vacuum; raising the temperature to 1150-1170° C.

(Continued)

in stages and performing a melting treatment for 12-24 hours; lowering the temperature to 600-700° C. in stages and then performing an annealing treatment for 5-7 days, the substances being cooled to room temperature in a furnace after the annealing treatment; and performing pressure sintering at 400-500° C.

6 Claims, 5 Drawing Sheets

(52) U.S. Cl.
CPC .............. *C01B 19/007* (2013.01); *C01G 3/006* (2013.01); *H01L 35/32* (2013.01); *C01P 2002/52* (2013.01); *C01P 2002/54* (2013.01); *C01P 2004/04* (2013.01); *C01P 2004/24* (2013.01); *C01P 2006/40* (2013.01)

(58) Field of Classification Search
CPC .............. C01P 2004/04; C01P 2002/54; C01P 2002/52; C01P 2006/40; C01P 2004/24
See application file for complete search history.

(56) References Cited

FOREIGN PATENT DOCUMENTS

| CN | 101823702 A | 9/2010 | | |
|---|---|---|---|---|
| CN | 102099937 A | 6/2011 | | |
| CN | 102194989 A | 9/2011 | | |
| CN | 102234843 A | 11/2011 | | |
| CN | 102674270 A | 9/2012 | | |
| EP | 0996174 A1 | 4/2000 | | |
| EP | 1289029 A2 | 3/2003 | | |
| JP | H11163422 A | 6/1999 | | |
| WO | WO2011/038055 A1 * | 3/2011 | ............. | H01L 35/18 |

OTHER PUBLICATIONS

Liu "Copper ion liquid-like thermoelectrics", Nature Materials ;vol. 11 ;May 2012 ; pp. 422-425.*

Ahn "Improvement in the thermoelectric performance of the crystals of halogen-substituted In4Se3-xH0.03 (H=F, Cl, Br, I): Effect of halogen-substitution on the thermoelectric properties in In4Se3-x", J. Mater. Chem., 2012, 22, 5730, Feb. 2012, pp. 5730-5736.*

Xiao "Phase transition and high temperature thermoelectric properties of copper selenide Cu2—xSe (0≤x≤0.25)", Chin. Phys. B vol. 20, No. 8 (2011) 087201, pp. 87201-1 to 087201-8.*

Liu, H. et al., "Ultrahigh Thermoelectric Performance by Electron and Phonon Critical Scattering in Cu2Se1-xlx," Advanced Materials, vol. 25, No. 45, Dec. 3, 2013, Published Online Sep. 10, 2013, 6 pages.

ISA State Intellectual Property Office of the People's Republic of China, International Search Report Issued in Application No. PCT/CN2014/078764, dated Aug. 27, 2014, WIPO, 4 pages.

* cited by examiner

US 10,177,295 B2

P-TYPE HIGH-PERFORMANCE THERMOELECTRIC MATERIAL WITH REVERSIBLE PHASE CHANGE, AND PREPARATION METHOD THEREFOR

FIELD OF THE INVENTION

The present invention relates to the field of thermoelectric materials, particularly to a novel high-performance thermoelectric material with a reversible phase transition, and more particularly to a P-type selenium-copper-based thermoelectric material and a preparation method therefor.

BACKGROUND OF THE INVENTION

Thermoelectric conversion technology is a technology of performing direct conversion between heat energy and electric energy by semiconductor materials, its principle is achieving thermoelectric electricity generation and thermoelectric refrigeration according to the Seebeck effect and the Peltier effect of the material. This technology has many advantages in application such as no pollution, no mechanical transmission, no noise, and high reliability, thus being widely used in recovery and utilization of industrial waste heat, special space power supply, miniature refrigeration devices, etc. In recent years, due to growing energy shortage and environmental pollution problems, the research of thermoelectric materials is getting more and more attention.

The optimum energy efficiency and high-low working temperature of thermoelectric materials are related to the essential properties of the materials, among which, the thermoelectric properties of the materials are determined by the dimensionless ZT values with a specific definition of $ZT=S^2\sigma T/k$, wherein S indicates the Seebeck coefficient, $\sigma$ is the conductivity, T is the absolute temperature, and k is the thermal conductivity of materials. The higher the ZT value of the material, the higher the conversion efficiency of the thermoelectric energy will be.

Application of thermoelectric materials in the refrigeration field is mainly for micro-device refrigeration. On the basis of the Peltier effect, in the π-type device formed by connecting P-type and N-type thermoelectric materials via a current-conducting plate, when an electric current passes through it, the device absorbs heat and performs refrigeration at one side, and radiates heat at the other side. The performance parameters of the thermoelectric refrigerator mainly include refrigerating efficiency, maximum refrigerating capacity, and maximum temperature difference. Refrigerating efficiency is the ratio of the refrigerating capacity to the input power. In the working state where the optimal input current is applied, the maximum refrigerating efficiency is:

$$\eta_{max} = \frac{T_c}{T_h - T_c} \cdot \frac{(1+Z\overline{T})^{1/2} - T_h/T_c}{(1+Z\overline{T})^{1/2} + 1},$$

wherein $T_c$ is the cold junction temperature and $T_h$ is the hot junction temperature, $$\overline{T} = \frac{T_h + T_c}{2},$$

i.e., $\overline{T}$ is the average temperature of $T_c$ and $T_h$, and $Z\overline{T}$ is the average thermoeletric figure of merit of the thermoelectric refrigerating device.

The maximum refrigerating capacity refers to the refrigerating capacity when the device is in the best working condition and the temperature difference between the two junctions of the device is zero:

$$Q_{c\cdot max} = \frac{1}{2} \cdot \frac{(S_p - S_n)^2 T_c^2}{R},$$

wherein $S_p$ is the Seebeck coefficient of P-type materials, $S_n$ is the Seebeck coefficient of N-type materials, and R is the resistance of the refrigerating device.

When the device is operated in a state without adscititious heat load, the temperature difference between the cold and hot junction is:

$$\Delta T = \frac{(S_p - S_n)T_c I - \frac{1}{2}I^2 R}{k},$$

wherein I is the input current, and k is the total heat conductivity coefficient of two junctions of the device.

If the thermoelectric refrigerating device is working in the corresponding optimum current, the temperature difference generated between the cold and hot junctions of the device is the maximum temperature difference:

$$\Delta T_{max} = T_h - T_c = \frac{1}{2} Z T_c^2.$$

The maximum temperature difference is only related to the ZT of the device.

One of the most important goals of scientific and technical workers is to find and pursue new thermoelectric materials with a high ZT value. In the present study of thermoelectric materials, researchers have proposed and found a series of new materials, mainly including skutterudite and clathrate systems of cage compounds based on the conception of "phonon glass-electron crystal," oxide systems with layered structures, lead telluride materials with rock-salt structures, diamond structure systems of a wide bandgap type, $Cu_2Se$ materials with liquid-like properties, and low-dimensional structure materials such as nanowires, ultra lattice, film, and nanostructured bulk materials, etc. At the same time, researchers have also found some new methods and means to improve the performance of thermoelectric materials, for example, the thermoeletric figure of merit can be greatly improved by the following methods: increasing the Seebeck coefficient by introducing a resonance energy level near the Fermi level, introducing a complex band-structure near the level of determining performance transmission, realizing two-dimensional plane electron waves in block materials, filling single or multiple elements in a cage structure compound, and reducing the phonon modes on the basis of liquid-like effects, etc. The ZT value of the bulk materials have been improved obviously by realization of these new materials and new methods, with the maximum value reaching more than 1.5, and the energy conversion efficiency more than 10%. However, because all of these new materials are a single structure system, the structure thereof will not vary within the temperature range of application, which, to a certain extent, limits the development of a wider material system. In the applications of micro-device refrigeration, the material system with an excellent thermoeletric figure of merit near the room temperature is relatively simple, and at present, the materials of wider commercial application mainly include a bismuth telluride-based material, for example, as described by CN101273474A. This material, which is prepared at a high cost and by a difficult method, has a thermoeletric figure of merit near room temperature of about 1.0, and a refrigeration efficiency of about 5%, which limit the wide application of thermoelectric conversion technology. In addition, multicomponent thermoelectric alloys have been developed as new types of thermoelectric materials, such as a $Cu_2CdSnSe_4$ semiconductor nanocrystal as disclosed by CN101823702A.

CN102674270A discloses a method of preparing the $Cu_2Se$ thermoelectric material by a low-temperature solid-phase reaction. Compound $Cu_2Se$ has a simple chemical composition, and undergoes a reversible phase transition in the vicinity of 400 K. After the phase transition, the high temperature phase is a cubic anti-fluorite structure, and the copper ion moves though the gap between the octahedrons and the tetrahedrons of the host lattice, thus having a fast ion-conducting property. Therefore, the $Cu_2Se$ is a widely used fast-ion conductor. The room temperature phase has a complex structure i.e., a complex monocline structure of double or triple cycles along the [010] direction. In such double or triple cycles, the copper atoms are squeezed between the Se atoms of the host lattice, and the Se atoms are combined with each other by van der Waals forces, so that the room temperature phase material exhibits a layered structure. During the transition from the room temperature phase to the high temperature phase, a portion of the copper ions between the selenium atoms are transferred to the vacuum layer and correspondingly the structure is changed into a stable cubic structure. During this process, the transfer of copper ions brings structural fluctuations which may affect the changes of electronic structure, and the phase transition process brings additional scattering of carriers, thus significantly increasing the Seebeck coefficient of the material, reducing the thermal conductivity, and further improving the thermoelectric figure of merit ZT of materials. Therefore, the $Cu_2Se$ thermoelectric materials have a good prospect in industrial application. The introduction of the phase transition material system into the study of thermoelectric materials enlarges the material system of thermoelectric study, and also provides a possibility of realizing a higher performance material, thus having a great significance for the study of thermoelectric materials.

SUMMARY OF THE INVENTION

The invention provides a P-type high-performance thermoelectric material with a reversible phase transition, characterized in that the thermoelectric material is an I-doped copper-selenide-based thermoelectric material, with a chemical composition of $Cu_2Se_{1-x}I_x$, wherein $0<x\leq0.08$, preferably $0.04\leq x\leq0.08$.

The compound of thermoelectric material provided herein is a semiconductor. As compared to the traditional bismuth-telluride-based thermoelectric materials near room temperature, this compound has a simple chemical composition, can be obtained from cheap raw materials at low cost, and has a high Seebeck coefficient and an excellent electrical conductivity as well as a low thermal conductivity in the phase transition region, with the thermoelectric figure of merit (ZT value) thereof reaching about 1 around the phase transition region. At the same time, by means of iodine doping, the phase transition temperature of the material can be reduced to 300~390 K, for example, about 380 K and 360 K, with the thermoeletric figure of merit (ZT value) in the phase transition region reaching 1.1 and 0.8 when x=0.04 and 0.08, respectively. Therefore, the thermoelectric material provided herein has good industrial application prospects in refrigeration of micro-devices, particularly, electronic industrial devices, CPU in the vicinity of room temperature, etc.

The phase transition temperature of the thermoelectric material provided by the present invention is 300~390 K, for example, 350~380 K.

The ZT value of the thermoelectric material provided herein is 0.1 or more at room temperature, and 0.8 or more in the phase transition temperature region, exhibiting an excellent thermoeletric figure of merit.

The thermoelectric material compound provided by the invention can also form a sandwich-shape layered structure with a thickness of 20~50 nm. Such a low dimensional structure also helps to improve the ZT value.

In another aspect, the invention further provides a method for preparing the P-type high-performance thermoelectric material with a reversible phase transition, comprising: weighing elemental copper metal, elemental selenium metal, and cuprous iodide at a mole ratio of (2−x):(1−x):x as raw materials and encapsulating the raw materials under a vacuum; gradiently heating the raw materials to 1150~1170° C. and keeping them thereat for 12~24 hours for melting; gradiently cooling the melt to 600~700° C. and keeping it thereat for 5~7 days for annealing treatment, followed by furnace cooling to room temperature; and pressure sintering the resulting material at 400~450° C.

Preferably, during the process of gradiently heating the raw materials to 1150~1170° C., the raw materials are first heated to 650~700° C. at a heating rate of 2.5~5° C./min and kept at this temperature for 1~2 hours; then heated to 1150~1170° C. at a heating rate of 0.8~2° C./min.

Preferably, during the process of gradiently cooling the melt to 600~700° C., the melt is first cooled down to 1000~1120° C. at a cooling rate of 5~10° C./min and kept at this temperature for 12~24 hours; then cooled down to 600~700° C. at a cooling rate of 5~10° C./min.

In the invention, the process of encapsulating the raw materials under a vacuum is preferably carried out under protection of inert gas, such as argon. The method therefor can be plasma encapsulation or flame gun encapsulation.

In the invention, the method for pressure sintering can be spark-plasma sintering. The pressure of the sintering can be 50~65 Mpa, and the pressure sintering duration can be 5~10 minutes.

The preparation method of the invention has the advantages of simple raw material, low cost, simple process flow, high controllability, good repeatability, and being suitable for large-scale production. The thermoelectric materials, $Cu_2Se_{1-x}I_x$ compounds prepared by the method of the invention, have a high Seebeck coefficient, high electrical conductivity and low thermal conductivity, and high thermoelectric figure of merit and energy conversion efficiency, for example, the refrigeration performance of the device consisting of the P-type $Cu_2Se_{1-x}I_x$ provided herein and N-type Yb-filled skutterudite thermoelectric material shows that the temperature difference of refrigeration increases by 20% or more in the phase transition region than that in the normal phase under the same current. The thermoelectric material compounds prepared by the method provided herein undergoes a phase transition within a low temperature range of 300 to 390 K, which is a reversible phase transition, and has a high thermoelectric figure of merit in the phase transition region, thus having good industrial application prospects in the refrigeration of micro-devices, particularly, electronic industrial devices, CPUs in the vicinity of room temperature, etc.

DETAILED DESCRIPTION OF THE EMBODIMENTS

The present invention will be further described with the following embodiments below with reference to the drawings. It should be understood that the drawings and the following embodiments are only used for explaining this invention, and do not limit this invention.

Hereinafter, the preparation of a new reversible phase transition thermoelectric material compound $Cu_2Se_{1-x}I_x$ ($0<x\leq0.08$) will be described as an example.

The compound synthesized by the present invention is $Cu_2Se_{1-x}I_x$, consisting of copper, selenium, and iodine, wherein $0<x\leq0.08$.

Figure 1:
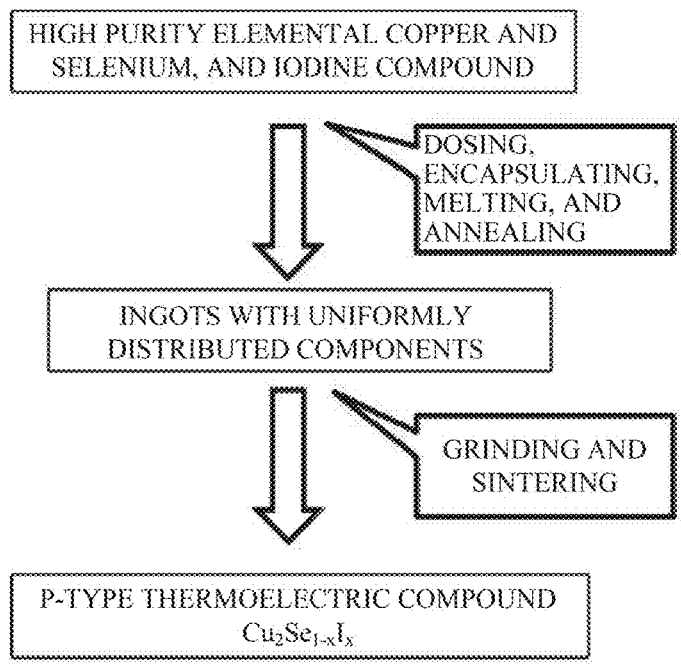
FIG. 1 is a schematic view showing a preparation flow of an exemplary thermoelectric material of the invention.

The preparation process of the present invention comprises vacuum packaging, melting, slow cooling, and annealing, as described by FIG. 1 which shows a schematic preparation flow of the thermoelectric material of the invention. In the invention, pure copper metal, pure selenium metal, and iodine compounds (for example cuprous iodide) are used as starting materials. Pure elemental copper (99.999%), pure elemental selenium (99.999%), and cuprous iodide compound (99.98%) as employed are abundant in source and easy to obtain. First, elemental copper metal, elemental selenium metal, and cuprous iodide are weighed at a mole ratio of $(2-x):(1-x):x$ and encapsulated under a vacuum. The vacuum encapsulation may be carried out in a glove compartment under protection of an inert gas such as argon, etc., or in a condition of an external vacuum. The vacuum encapsulation may be plasma encapsulation or flame gun encapsulation. During the encapsulation, the quartz tube is vacuumized so as to maintain the internal pressure at 1-10000 Pa. Copper and selenium can be directly encapsulated in the quartz tube under vacuum, or be placed in a pyrolytic boron nitride crucible (PBN), followed by being encapsulated in the quartz tube.

Then, the starting materials are subjected to a high temperature melting treatment. The melting process of the present invention can be carried out in a box-type furnace. Firstly, the starting materials are heated to 650-700° C. at a heating rate of 2.5-5° C./min, and kept at the temperature for 1-2 hours; then heated to 1150-1170° C. at a heating rate of 0.8-2° C./min, and kept at the temperature for 12-24 hours for melting. The melt is slowly cooled down to 1000-1120° C. at a cooling rate of 5-10° C./min, and kept at the temperature for 12-24 hours; then slowly cooled down to 600-700° C. at a cooling rate of 5-10° C./min, and kept at the temperature for 5~7 days for annealing; and finally cooled down to room temperature by the manner of natural furnace cooling.

Finally, the annealed ingots are ground into a powder, then sintered under pressure. Spark plasma sintering (SPS) is chosen as the sintering method, wherein a size of the graphite mold with a size of Φ10 mm is used, and the inner wall and pressure head are sprayed with BN for insulation; the sintering temperature is 450° C.-500° C., the sintering pressure is 50-65 MPa, and the sintering duration is 5-10 minutes. A dense bulk is obtained by the sintering. It is observed under a scanning electron microscope that the compounds prepared exhibit a sandwich-shape layered structure with a thickness of a few tens of nanometers (20~50 nm) at room temperature. High-resolution electron microscopy observation validates that this material mainly comprises small nanocrystallines, and nano defects such as dislocations, twins, etc. (see FIGS. 3C and 3D).

Figure 2:
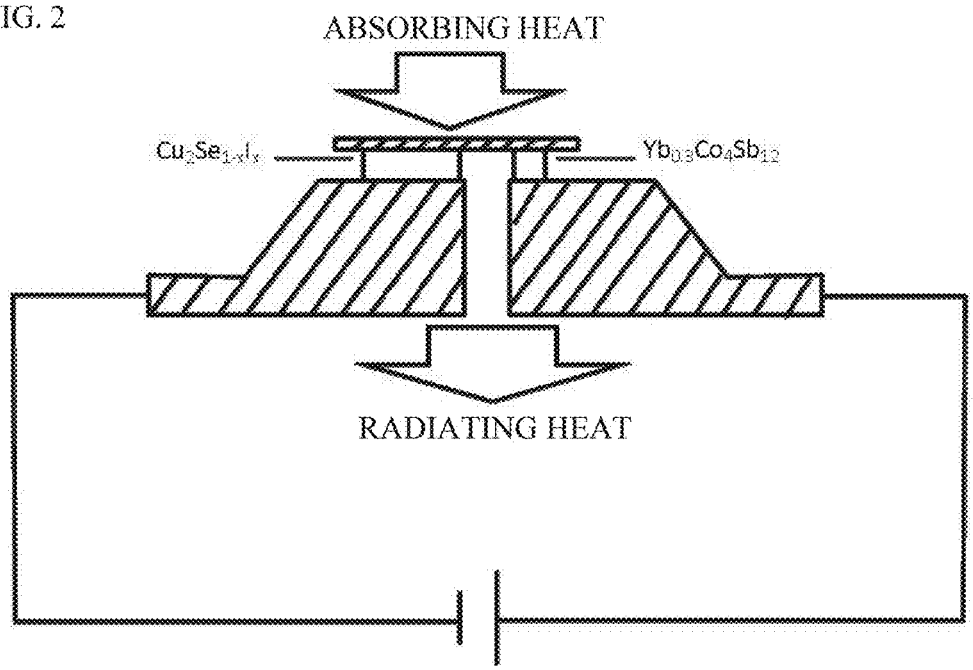
FIG. 2 is a schematic view of a single-pair thermoelectric device consisting of the P-type $Cu_2Se_{1-x}I_x$ provided herein and N-type $Yb_{0.3}Co_3Sb_{12}$.
Figure 8:
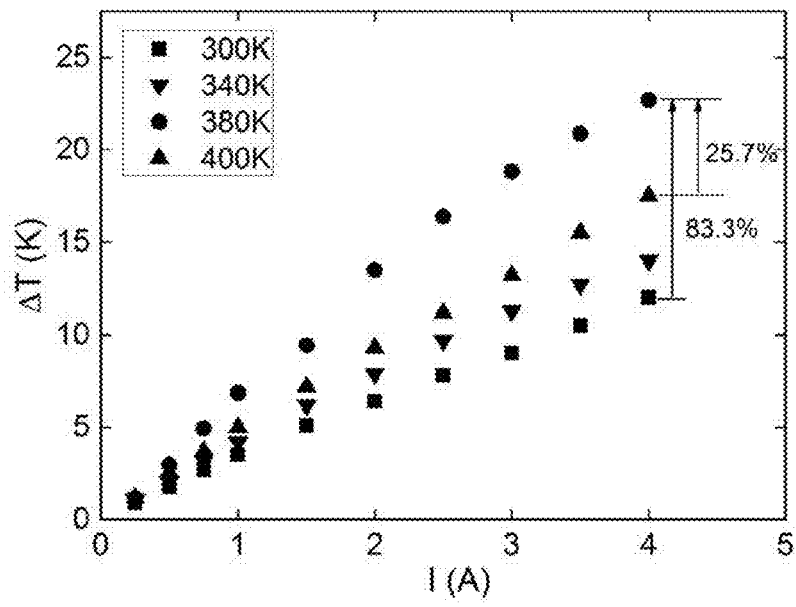
FIG. 8 shows refrigeration performance of the single-pair thermoelectric device consisting of the P-type $Cu_2Se_{1-x}I_x$ provided herein and N-type $Yb_{0.3}Co_3Sb_{12}$.

P-type $Cu_2Se_{1-x}I_x$ and N-type Yb-filled skutterudite ($Yb_{0.3}Co_3Sb_{12}$) thermoelectric materials are connected in a π-shape (See FIG. 2) to form a refrigeration test device with a single-pair of legs, wherein a nickel sheet with a thickness of 0.2 mm is selected as the guide plate, 10 mm×10 mm×6 mm copper blocks are selected as the hot junction heat absorbing electrodes, the size of the P-type thermoelectric material $Cu_2Se_{1-x}I_x$ is 3 mm×3 mm×1 mm, the size of N-type thermoelectric material $Yb_{0.3}Co_3Sb_{12}$ is 1 mm×1 mm×1 mm, and the surfaces of the P-type $Cu_2Se_{1-x}I_x$ and N-type $Yb_{0.3}Co_3Sb_{12}$ samples are treated by nickel electroplating and are connected to the guide plate and the hot junction heat absorbing electrodes by tin soldering. FIG. 8 shows the refrigeration performance of the single-pair thermoelectric device consisting of the P-type $Cu_2Se_{1-x}I_x$ provided herein and N-type $Yb_{0.3}Co_3Sb_{12}$. As shown in FIG. 8, the temperature difference of refrigeration in the phase transition region is higher than that after the phase transition and that at room temperature.

The preparation method of the invention has the advantages of simple raw material, low cost, simple process flow, high controllability, and good repeatability. The thermoelectric materials provided herein have a high Seebeck coefficient, a high electrical conductivity, and a low thermal conductivity.

Hereinafter, the present invention will be better described with the following representative examples. It is understood that the following examples are only used to explain this invention and do not limit the scope of this invention, and any non-essential improvements and modifications made by a person skilled in the art based on this invention all fall into the protection scope of this invention. The specific parameters below such as temperature and time are only exemplary, and a person skilled in the art can choose proper values within an appropriate range according to the description of this article, and are not restricted to the specific values cited below.

Example 1: Preparation and Thermoelectric Properties of $Cu_2Se$

Figure 3A:
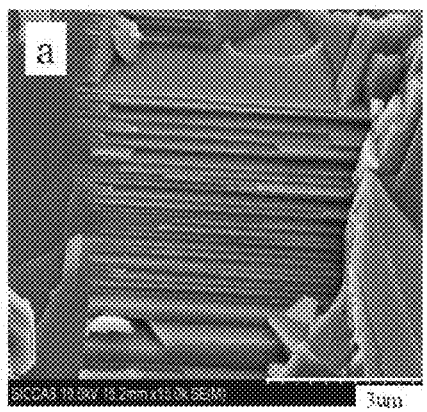
FIG. 3A shows a scanning electron microscopy image of the $Cu_2Se$ compounds in example 1.
Figure 3B:
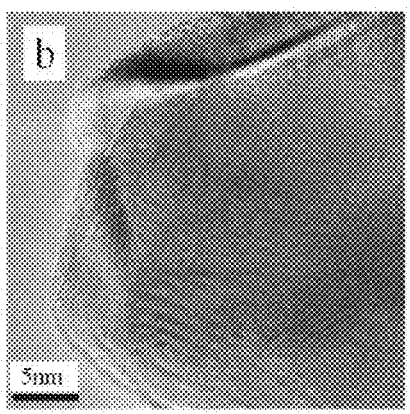
FIG. 3B shows a high resolution scanning electron microscope image of the $Cu_2Se$ compounds in example 1.
Figure 4:
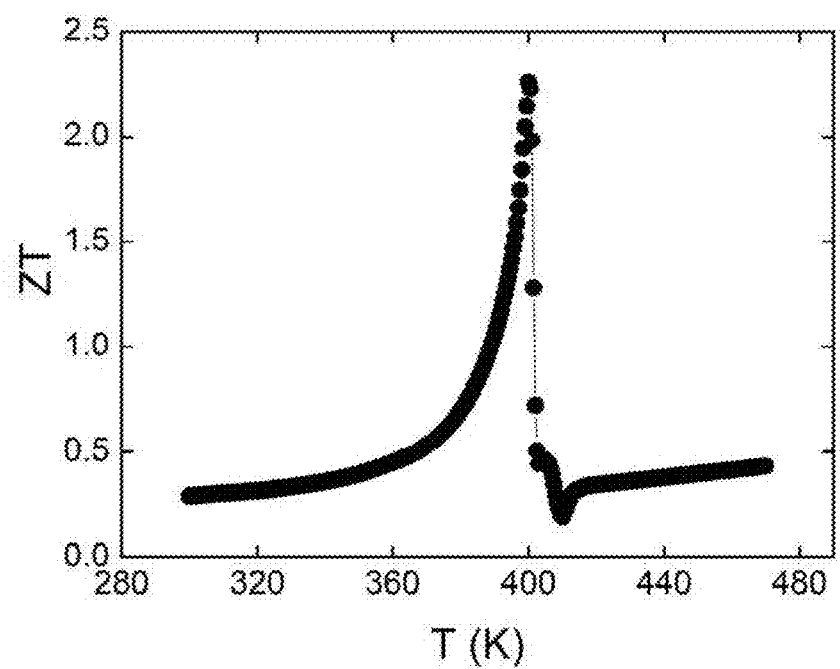
FIG. 4 shows temperature dependence of a figure of merit ZT of the compound $Cu_2Se$ of example 1 in the phase transition region.

As raw materials, pure metal Cu and Se are weighed at a mole ratio of 2:1, placed into a PBN crucible, and then put into a quartz tube. The quartz tube is vacuumized and supplied with protective Ar gas for 3 times, and then sealed by plasma flame or gas flame in a glove box. A small amount of Ar gas is pumped into the quartz tube as an inert atmosphere to protect the raw material. The raw materials are heated to 650-700° C. at a heating rate of 2.5 5° C./min, and kept at this temperature for 1-2 hours; then heated to 1150-1170° C. at a heating rate of 0.8-2° C./min, and kept at the temperature for 12-24 hours for melting; then slowly cooled down to 1000-1120° C. at a cooling rate of 5-10° C./min, and kept at this temperature for 12~24 hours; then slowly cooled down to 600-700° C. at a cooling rate of 5-10° C./min, and kept at this temperature for 5-7 days; and finally cooled down to room temperature by the manner of natural furnace cooling. The resulting ingots are ground into powder, then sintered by spark plasma sintering at 400-450° C. under a pressure of 50-65 MPa for 5-10 minutes, to give a dense bulk with a density of 97% or more. The field emission electron microscope image shows that the $Cu_2Se$ at room temperature exhibits a sandwich-shape layered structure with a thickness of a few tens of nanometers. The transmission electron microscopy (TEM) images show that there are no large crystalline grains but many nanocrystallines and nano defects such as dislocations and twins in the materials (as shown in FIGS. 3A and 3B). Such a complex structure can further enhance the thermoelectric properties. Measurements of thermoelectric performance show that the material undergoes a phase transition at around 400 K, which is a reversible phase transition. The material has a very high Seebeck coefficient, an excellent electrical conductivity, and a good power factor in the phase transition region. At the same time, the thermal conductivity of the material is very low in the phase transition region. According to the measurement and calculation, the ZT value of the material is about 0.2 at room temperature, and can reach 2.3 in the phase transition region (around 400 K) (see FIG. 4).

Figure 3C:
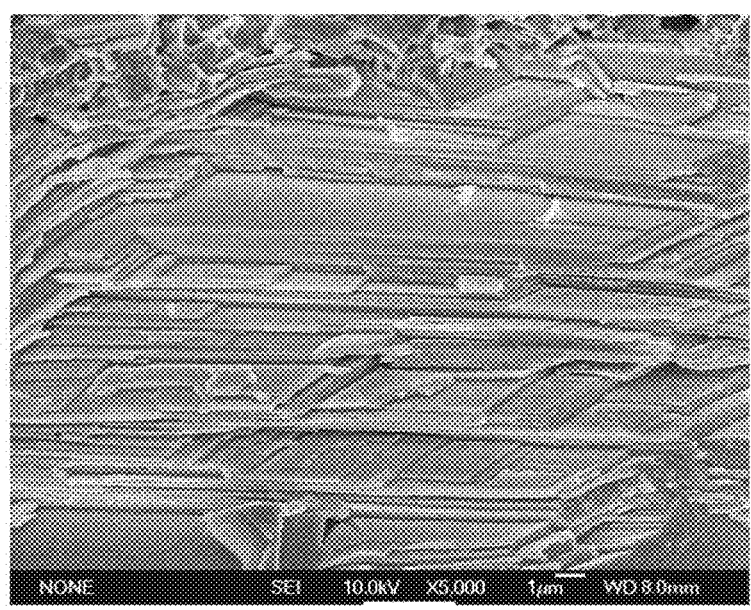
FIG. 3C shows a scanning electron microscopy image of the thermoelectric material of example 2 of the invention.
Figure 3D:
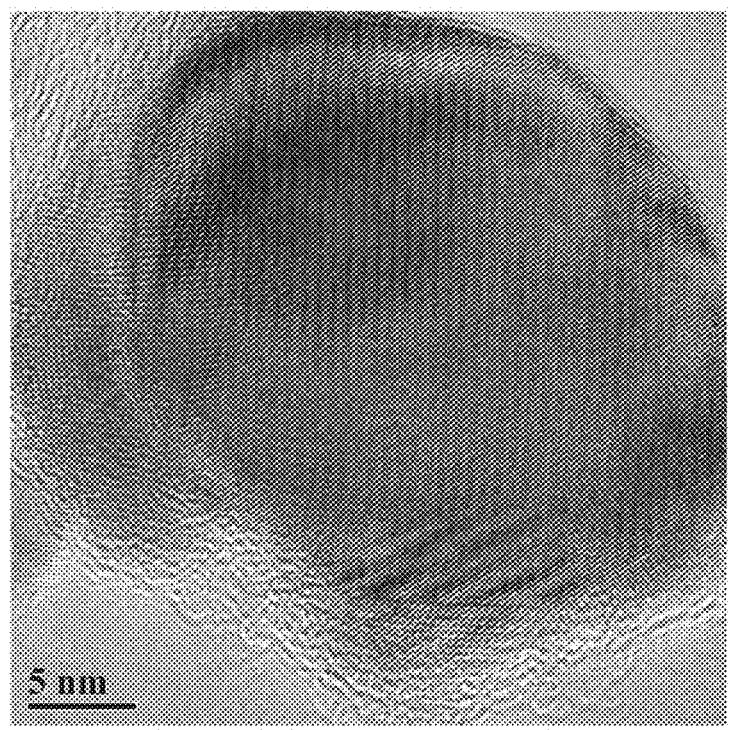
FIG. 3D shows a high resolution scanning electron microscopy image of the thermoelectric material of example 2 of the invention.
Figure 5:
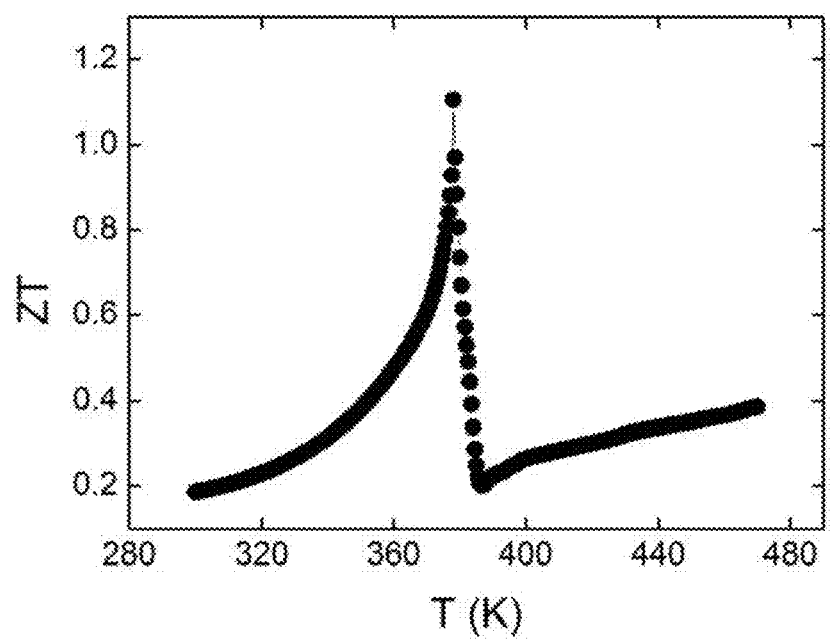
FIG. 5 shows temperature dependence of the figure of merit ZT of the compound $Cu_2Se_{0.96}I_{0.04}$ of example 2 in the phase transition region.

Example 2: Preparation and Thermoelectric Properties of $Cu_2Se_{0.96}I_{0.04}$ As raw materials, pure metal Cu, Se, and compound cuprous iodide are weighed at a mole ratio of 1.96:0.96:0.04, placed into a PBN crucible, and then put into a quartz tube. The quartz tube is vacuumized and supplied with protective Ar gas 3 times, then sealed by plasma flame or gas flame in a glove box. A small amount of Ar gas is pumped into the quartz tube as inert atmosphere to protect the raw material. The raw materials are heated to 650-700° C. at a heating rate of 2.5-5° C./min, and kept at this temperature for 1-2 hours; then heated to 1150-1170° C. at a heating rate of 0.8-2° C./min, and kept at the temperature for 12-24 hours for melting; then slowly cooled down to 1000-1120° C. at a cooling rate of 5-10° C./min, and kept at this temperature for 12-24 hours; then slowly cooled down to 600-700° C. at a cooling rate of 5-10° C./min, and kept at this temperature for 5-7 days; and finally cooled down to room temperature by the manner of natural furnace cooling. The resulting ingots are ground into powder, then sintered by spark plasma sintering at 400-450° C. under a pressure of 50-65 MPa for 5-10 minutes to give a dense bulk with a density of 97% or more. The field emission electron microscope image shows that the $Cu_2Se$ at room temperature exhibits a sandwich-shape layered structure with a thickness of a few tens of nanometers. The TEM images show that there are no large crystalline grains but many nanocrystallines and nano defects such as dislocations and twins in the material (as shown in FIGS. 3C and 3D). Measurements of thermoelectric performance show that the material undergoes a phase transition at around 380 K, which is a reversible phase transition. The material has a very high Seebeck coefficient, an excellent electrical conductivity, and a good power factor in the phase transition region. At the same time, the thermal conductivity of the material is very low in the phase transition region. According to the measurement and calculation, the ZT value of the material is about 0.2 at room temperature, and can reach 1.1 in the phase transition region (around 380 K) (see FIG. 5).

Figure 6:
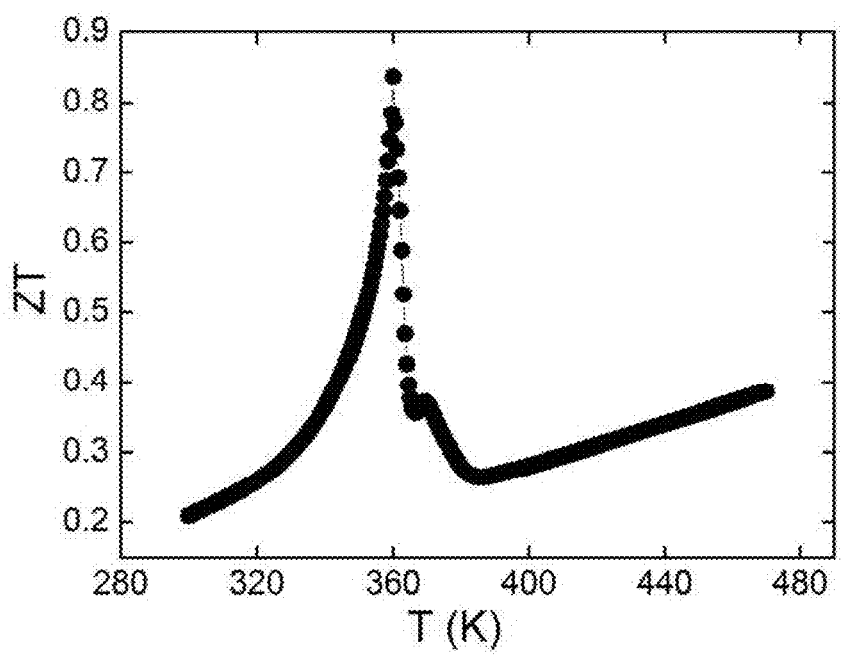
FIG. 6 shows temperature dependence of the figure of merit ZT of the compound $Cu_2Se_{0.92}I_{0.08}$ of example 3 in the phase transition region.

Example 3: Preparation and Thermoelectric Properties of $Cu_2Se_{0.92}I_{0.08}$ As raw materials, pure metal Cu, Se, and compound cuprous iodide are weighed at a mole ratio of 1.92:0.92:0.08, and placed into a PBN crucible, and then put into a quartz tube. The quartz tube is vacuumized and supplied with protective Ar gas 3 times, and then sealed by plasma flame or gas flame in a glove box. A small amount of Ar gas is pumped into the quartz tube as inert atmosphere to protect the raw material. The raw materials are heated to 650-700° C. at a heating rate of 2.5-5° C./min, and kept at this temperature for 1-2 hours; then heated to 1150-1170° C. at a heating rate of 0.8-2° C./min, and kept at the temperature for 12-24 hours for melting; then slowly cooled down to 1000-1120° C. at a cooling rate of 5-10° C./min, and kept at this temperature for 12-24 hours; then slowly cooled down to 600-700° C. at a cooling rate of 5-10° C./min, and kept at this temperature for 5-7 days; and finally cooled down to room temperature by the manner of natural furnace cooling. The resulting ingots are ground into powder, then sintered by spark plasma sintering at 400-450° C. under a pressure of 50-65 MPa for 5-10 minutes, to give a dense bulk with a density of 97% or more. Measurements of thermoelectric performance show that the material undergoes a phase transition at around 360 K, which is a reversible phase transition. The material has a very high Seebeck coefficient, an excellent electrical conductivity, and a good power factor in the phase transition region. At the same time, the thermal conductivity of the material is very low in the phase transition region. According to the measurement and calculation, the ZT value of the material is about 0.2 at room temperature, and can reach 0.8 in the phase transition region (around 360 K) (see FIG. 6).

Figure 7:
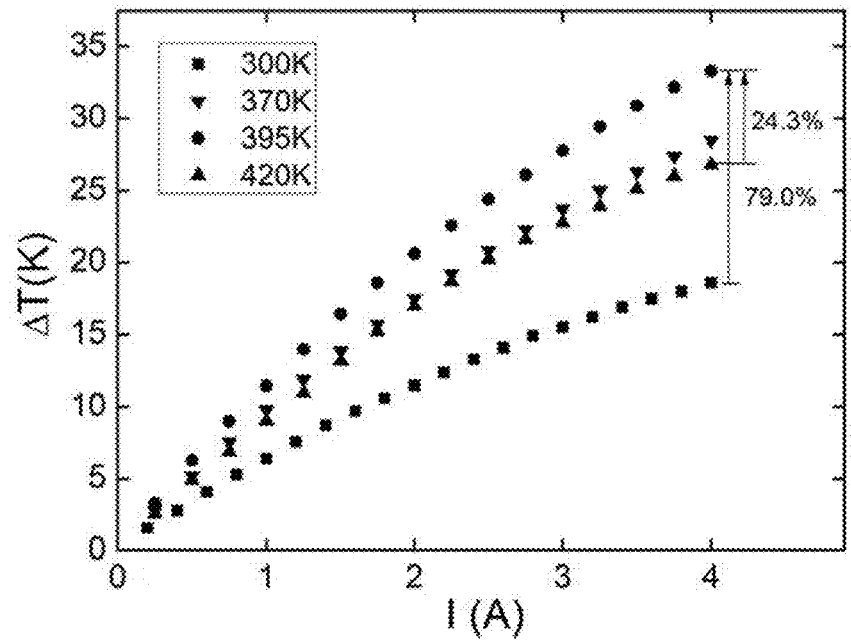
FIG. 7 shows the refrigeration performance of the single-pair thermoelectric device consisting of the P-type $Cu_2Se$ provided herein and N-type $Yb_{0.3}Co_3Sb_{12}$.

Example 4: Preparation for the Single-Pair Device Consisting of P-Type $Cu_2Se$ and N-Type $Yb_{0.3}Co_3Sb_{12}$ and Performance Measurements Therefor P-type $Cu_2Se$ and N-type $Yb_{0.3}Co_3Sb_{12}$ are selected for preparation of the single-pair device. A $Cu_2Se$ sample of 3 mm×3 mm×1 mm and a $Yb_{0.3}Co_3Sb_{12}$ sample of 1 mm×1 mm×1 mm are prepared by cutting. After surface grinding, the samples are soaked in a mixture of nitric acid and hydrofluoric acid ($HNO_3$:HF:$H_2O$=3:1:6) for 1-3 minutes, then ultrasonically cleaned in deionized water, then treated by electroplating, wherein the electric current is 0.05-0.08 A, the samples are first pre-electroplated in a nickel chloride solution of 1 mol/L for 1-3 minutes, and then electroplated in a nickel sulfamate solution of 200 g/L at 40° C. for 3-5 minutes. After polishing the surrounding electroplated nickel, the resulting samples are briefly washed in deionized water. Then the samples are welded between the copper electrodes and the heat conducting plate by tin soldering. The measurement is carried out under vacuum of 1-20 Pa, with the test current being 0.25-4 A. The relationship between the maximum temperature difference of refrigeration and the current are measured before the phase transition (300 K, 370 K), in the phase transition region (about 395 K) and after the phase transition (420 K), respectively. According to the test results, when the current is 4 A, the maximum temperature difference of refrigeration of the device in phase transition region is 24.3% higher than that in the normal phase after phase transition and 79% higher than that at the room temperature phase (FIG. 7).

Example 5: Preparation for the Single-Pair Device Consisting of P-Type $Cu_2Se_{0.96}I_{0.04}$ and N-Type $Yb_{0.3}Co_3Sb_{12}$ and Performance Measurements Therefor P-type $Cu_2Se_{0.96}I_{0.04}$ and N-type $Yb_{0.3}Co_3Sb_{12}$ are selected for preparation of the single-pair device. A $Cu_2Se_{0.96}I_{0.04}$ sample of 3 mm×3 mm×1 mm and a $Yb_{0.3}Co_3Sb_{12}$ sample of 1 mm×1 mm×1 mm are prepared by cutting. After surface grinding, the samples are soaked in a mixture of nitric acid and hydrofluoric acid ($HNO_3$:HF:$H_2O$=3:1:6) for 1-3 minutes, then ultrasonically cleaned in deionized water, then treated by electroplating, wherein the electric current is 0.05-0.08 A, the samples are first pre-electroplated in a nickel chloride solution of 1 mol/L for 1-3 minutes, and then electroplated in a nickel sulfamate solution of 200 g/L at 40° C. for 3-5 minutes. After polishing the surrounding electroplated nickel, the resulting samples are briefly washed in deionized water. Then the samples are welded between the copper electrodes and the heat conducting plate by tin soldering. The measurement is carried out under vacuum of 1-20 Pa, with the test current being 0.25-4 A. The relationship between the maximum temperature difference of refrigeration and the current are measured before the phase transition (300 K, 340 K), in the phase transition region (about 380 K) and after the phase transition (400 K), respectively. According to the test results, when current is 4 A, the maximum temperature difference of refrigeration of the device in phase transition region is 25.7% higher than that in the normal phase after phase transition and 83.3% higher than that in the room temperature phase (FIG. 8).

INDUSTRIAL APPLICABILITY

The thermoelectric material provided herein has a simple chemical composition, a low dimensional layered structure, and a high ZT value, and thus can be developed as a new type of thermoelectric material. The method of the present invention is simple, feasible, low cost, and suitable for large-scale production.

The invention claimed is:
1. A method for preparing the P-type high-performance thermoelectric material with the reversible phase transition, characterized in that a chemical composition of the thermoelectric material is $Cu_2Se_{1-x}I_x$, wherein 0<x≤0.08, and wherein the thermoelectric material has a sandwich-shape layered structure with a thickness of 20~50 nm, the method comprising:
    weighing elemental copper metal, elemental selenium metal, and cuprous iodide at a mole ratio of (2−x):(1−x):x as raw materials and encapsulating the raw materials under a vacuum;
    gradiently heating the raw materials by first heating the raw materials to 650~700° C. at a heating rate of 2.5~5° C./min and keeping them thereat for 1~2 hours, then further heating the raw materials to 1150~1170° C. at a heating rate of 0.8~2° C./min and keeping them thereat for 12~24 hours for melting;
    gradiently cooling the melt to 600~700° C. and keeping it thereat for 5~7 days for annealing treatment;
    furnace-cooling the melt to room temperature; and
    heating the room temperature melt to 400~450° C. for pressure sintering.
2. The method according to claim 1, characterized in that a process of encapsulating the raw materials under a vacuum is carried out by plasma encapsulation or flame gun encapsulation under protection of an inert gas.
3. The method according to claim 1, characterized in that a method for pressure sintering is spark-plasma sintering, a pressure of the sintering is 50~65 Mpa, and a sintering duration is 5~10 minutes.
4. A method for preparing the P-type high-performance thermoelectric material with the reversible phase transition, characterized in that a chemical composition of the thermoelectric material is $Cu_2Se_{1-x}I_x$, wherein 0<x≤0.08, and wherein the thermoelectric material has a sandwich-shape layered structure with a thickness of 20~50 nm, the method comprising:
    weighing elemental copper metal, elemental selenium metal, and cuprous iodide at a mole ratio of (2−x):(1−x):x as raw materials and encapsulating the raw materials under a vacuum;
    gradiently heating the raw materials to 1150~1170° C. and keeping them thereat for 12~24 hours for melting;
    gradiently cooling the melt by first cooling the melt to 1000~1120° C. at a cooling rate of 5~10° C./min and keeping it thereat for 12~24 hours, then further cooling the melt to 600~700° C. at a cooling rate of 5~10° C./min and keeping it thereat for 5~7 days for annealing treatment;
    furnace-cooling the melt to room temperature; and
    heating the room temperature melt to 400~450° C. for pressure sintering.
5. The method according to claim 4, characterized in that a process of encapsulating the raw materials under a vacuum is carried out by plasma encapsulation or flame gun encapsulation under protection of an inert gas.
6. The method according to claim 4, characterized in that a method for pressure sintering is spark-plasma sintering, a pressure of the sintering is 50~65 Mpa, and a sintering duration is 5~10 minutes.

* * * * *